United States Patent
Kanazawa et al.

(10) Patent No.: US 12,341,315 B2
(45) Date of Patent: Jun. 24, 2025

(54) OPTICAL SEMICONDUCTOR CHIP

(71) Applicant: Nippon Telegraph and Telephone Corporation, Tokyo (JP)

(72) Inventors: Shigeru Kanazawa, Musashino (JP); Yuta Ueda, Musashino (JP); Takahiko Shindo, Musashino (JP); Meishin Chin, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 384 days.

(21) Appl. No.: 17/915,281

(22) PCT Filed: Apr. 17, 2020

(86) PCT No.: PCT/JP2020/016937
§ 371 (c)(1),
(2) Date: Sep. 28, 2022

(87) PCT Pub. No.: WO2021/210177
PCT Pub. Date: Oct. 21, 2021

(65) Prior Publication Data
US 2023/0139615 A1    May 4, 2023

(51) Int. Cl.
*G02F 1/01* (2006.01)
*G02F 1/015* (2006.01)
(Continued)

(52) U.S. Cl.
CPC .......... *H01S 5/0085* (2013.01); *G02F 1/0155* (2021.01); *G02F 1/025* (2013.01); *H01S 5/12* (2013.01)

(58) Field of Classification Search
CPC ...................................................... G02F 1/01
(Continued)

(56) References Cited

U.S. PATENT DOCUMENTS 6,055,087 A * 4/2000 Kwon ............... G02F 1/015
359/254
2004/0207896 A1* 10/2004 Aoki ................ H04B 10/40
359/237
(Continued)

FOREIGN PATENT DOCUMENTS

JP    2004126108 A  *  4/2004
JP    2004219949 A  *  8/2004
(Continued)

OTHER PUBLICATIONS

Shigeru Kanazawa et al., *Equalizer-Free Transmission of 100-Gv/S 4-PAM Signal Generated by Flip-Chip Interconnection EADFB Laser Module*, Journal of Lightwave Technology, vol. 35, No. 4, Feb. 15, 2017, pp. 775-780.

*Primary Examiner* — Kaveh C Kianni
(74) *Attorney, Agent, or Firm* — Workman Nydegger (57) ABSTRACT

An optical semiconductor chip of the present disclosure includes a high frequency line between an electrode pad receiving a modulation signal and a modulation electrode on the optical waveguide having a light absorption layer. The depletion layer capacitance generated in the light absorption layer is canceled by an inductor component of the high frequency line. When a portion directly below the high frequency line is embedded with a low-dielectric-constant material or is made hollow, the parasitic capacitance is further reduced. The high frequency line may have a zigzag shape as well as a linear shape. The electrode pad on the optical semiconductor chip can be connected to other substrates including RF lines for modulation signal input by bumps or wire bonding.

5 Claims, 11 Drawing Sheets

(51) Int. Cl.
    *G02F 1/025*     (2006.01)
    *H01S 5/00*     (2006.01)
    *H01S 5/12*     (2021.01)

(58) Field of Classification Search
    USPC .......................................................... 385/2
    See application file for complete search history.

(56) References Cited

U.S. PATENT DOCUMENTS

| | | | |
|---|---|---|---|
| 2017/0310078 A1* | 10/2017 | Hirayama | H01S 5/02345 |
| 2017/0310080 A1* | 10/2017 | Zhu | H01S 5/026 |
| 2024/0201337 A1* | 6/2024 | Smith | G01S 17/10 |

FOREIGN PATENT DOCUMENTS

| | | | | | |
|---|---|---|---|---|---|
| JP | 2011-009456 A | | 1/2011 | | |
| JP | 2017-199906 A | | 11/2017 | | |
| TW | 201222768 A | * | 6/2012 | ........... | G02B 26/001 |

\* cited by examiner

OPTICAL SEMICONDUCTOR CHIP

BACKGROUND ART

The present invention relates to an optical semiconductor chip used in an optical transmitter or the like. The capacity of optical communication is increasing from backbone networks to access system networks. Larger capacities and higher performance are also required for optical transmitters, and a high-speed optical modulator is required as one key technology. An electro absorption (EA) optical modulator using an electro absorption effect of a semiconductor is one typical high-speed optical modulator that uses certain light from a laser light source.

Figure 1:
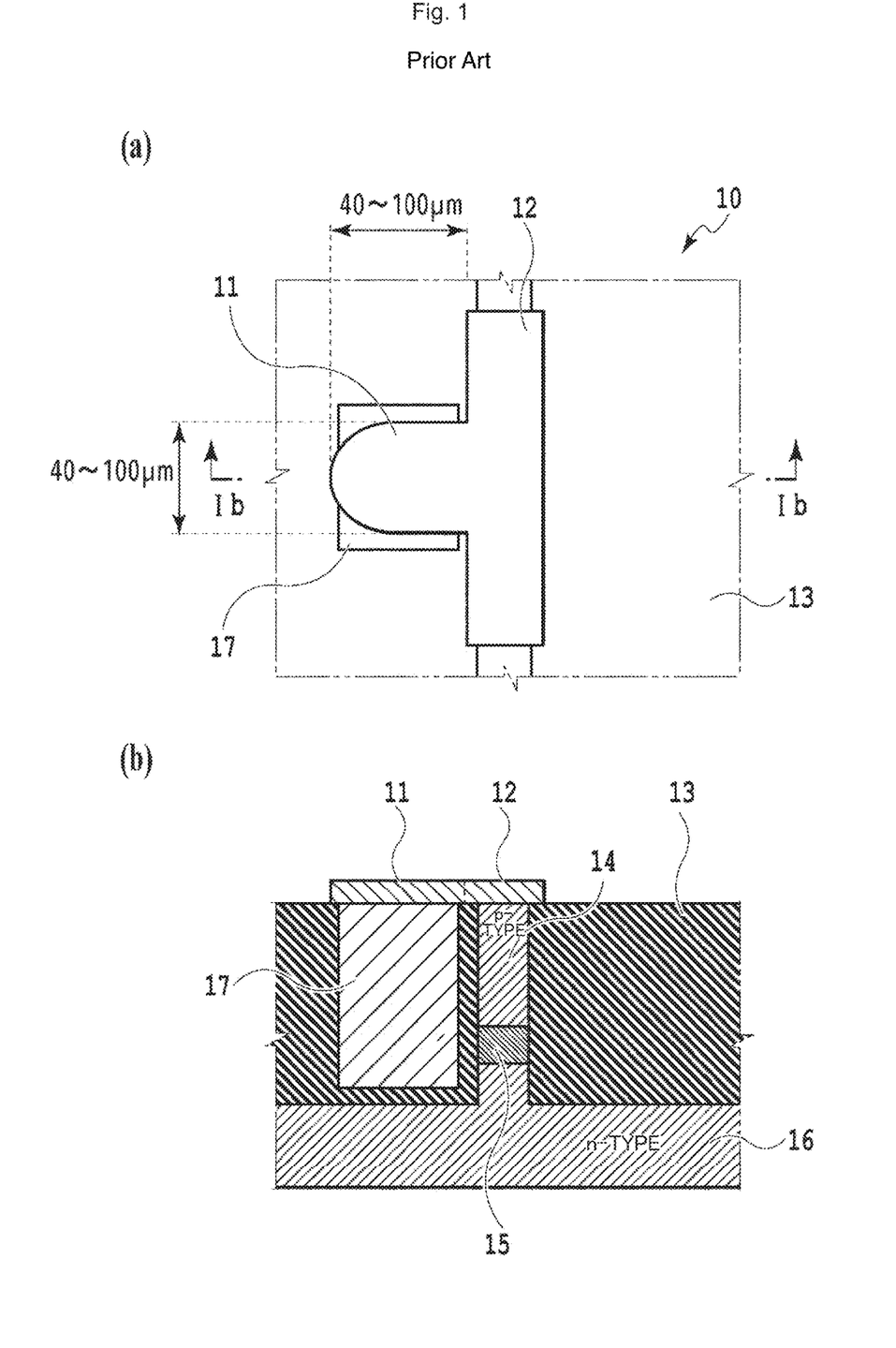
FIG. 1 shows diagrams of a configuration of an electro absorption (EA) optical modulator chip in the conventional art.

FIG. 1 shows diagrams of a configuration of an EA optical modulator chip in the conventional art. FIG. 1(a) is a top view of a part of an EA optical modulator chip 10 in which an EA optical modulator unit is formed, and FIG. 1(b) is a cross-sectional view of a substrate taken along the line Ib-Ib. First, referring to the cross-sectional view of FIG. 1(b), an EA optical modulator has a waveguide structure in which a light absorption layer 15 and a p-type semiconductor layer 14 are formed on an n-type semiconductor substrate 16. Both sides of an optical waveguide are embedded by an insulation layer 13. Light from a laser unit (not shown in FIG. 1) is modulated by applying a baseband signal (hereinafter referred to as a modulation signal) to a modulation electrode 12 formed on the p-type semiconductor layer 14. Referring to FIG. 1(a), in order to input a modulation signal via wire bonding, bumps or the like, the electrode is extended from the modulation electrode 12 substantially perpendicular to the optical waveguide, and an electrode pad 11 is formed. The electrode pad 11 has a size of about 40 to 100 μm square and has a structure directly connected to the modulation electrode 12.

The portion under the electrode pad 11 is embedded with a material 17 having a lower dielectric constant than that of a semiconductor insulation layer 15, and thereby the parasitic capacitance of the electrode pad 11 is reduced. When the parasitic capacitance of the electrode pad 11 receiving a modulation signal is reduced, deterioration of frequency response characteristics and reflection characteristics is prevented in a high frequency range exceeding 10 GHz.

The above EA optical modulator chip is formed on an optical semiconductor substrate having a function of conversion between light and electricity, and although not limited, in many cases, a chip is realized by disconnecting a plurality of circuits formed on a wafer-shaped optical semiconductor substrate. The EA optical modulator chip shown in FIG. 1 is also called an optical semiconductor chip.

Figure 2:
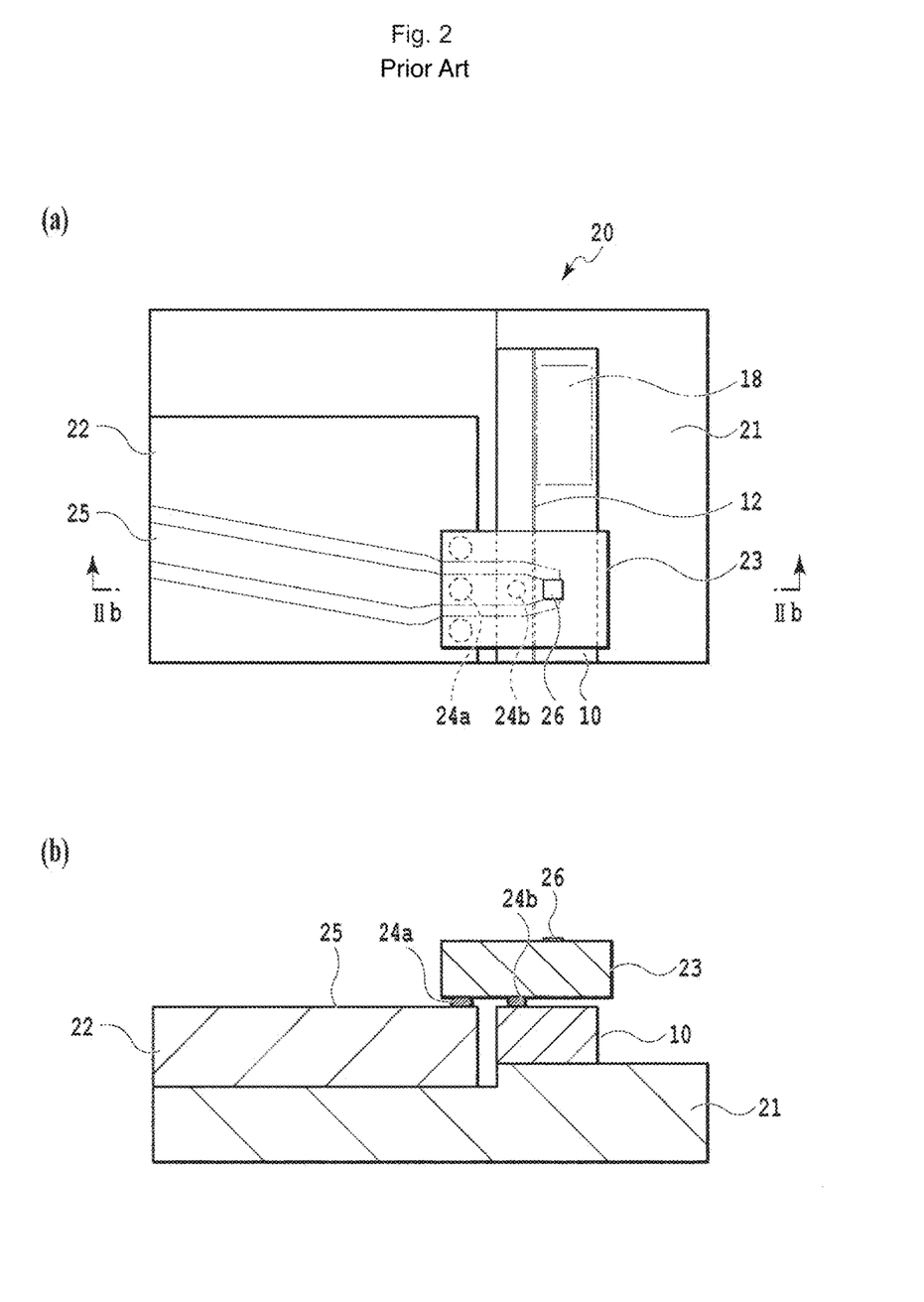
FIG. 2 shows diagrams of a configuration of an EA optical modulator subassembly according to an external modulation method.

FIG. 2 shows diagrams of a configuration of an EA optical modulator subassembly according to an external modulation method. FIG. 2(a) shows a top view of a subassembly 20, and FIG. 2(b) shows a cross-sectional view of the subassembly 20 taken along the line IIb-IIb. Referring to FIG. 2(b), in the subassembly 20, a radio frequency (RF) wiring board 22 and an optical semiconductor chip 10 are mounted on a subcarrier 21. The RF wiring board 22 and the optical semiconductor chip 10 are connected by a terminator integrated chip 23 via gold bumps 24a and 24b.

Referring to FIG. 2(a), the optical semiconductor chip 10 includes a distributed feedback (DFB) laser 18 and an optical waveguide, and the above FIG. 1 shows a part of the optical semiconductor chip 10 in which the modulation electrode 12 of the optical waveguide is formed. The RF wiring board 22 includes an RF pattern 25 receiving a modulation signal, and similarly, an RF pattern is formed in the terminator integrated chip 23. In the terminator integrated chip 23, a resistor 26 for terminating a modulation signal is formed. The RF pattern 25 is electrically connected to the electrode pad 11 of the optical semiconductor chip 10 via the gold bump 24a, the terminator integrated chip 23, and the gold bump 24b.

Figure 3:
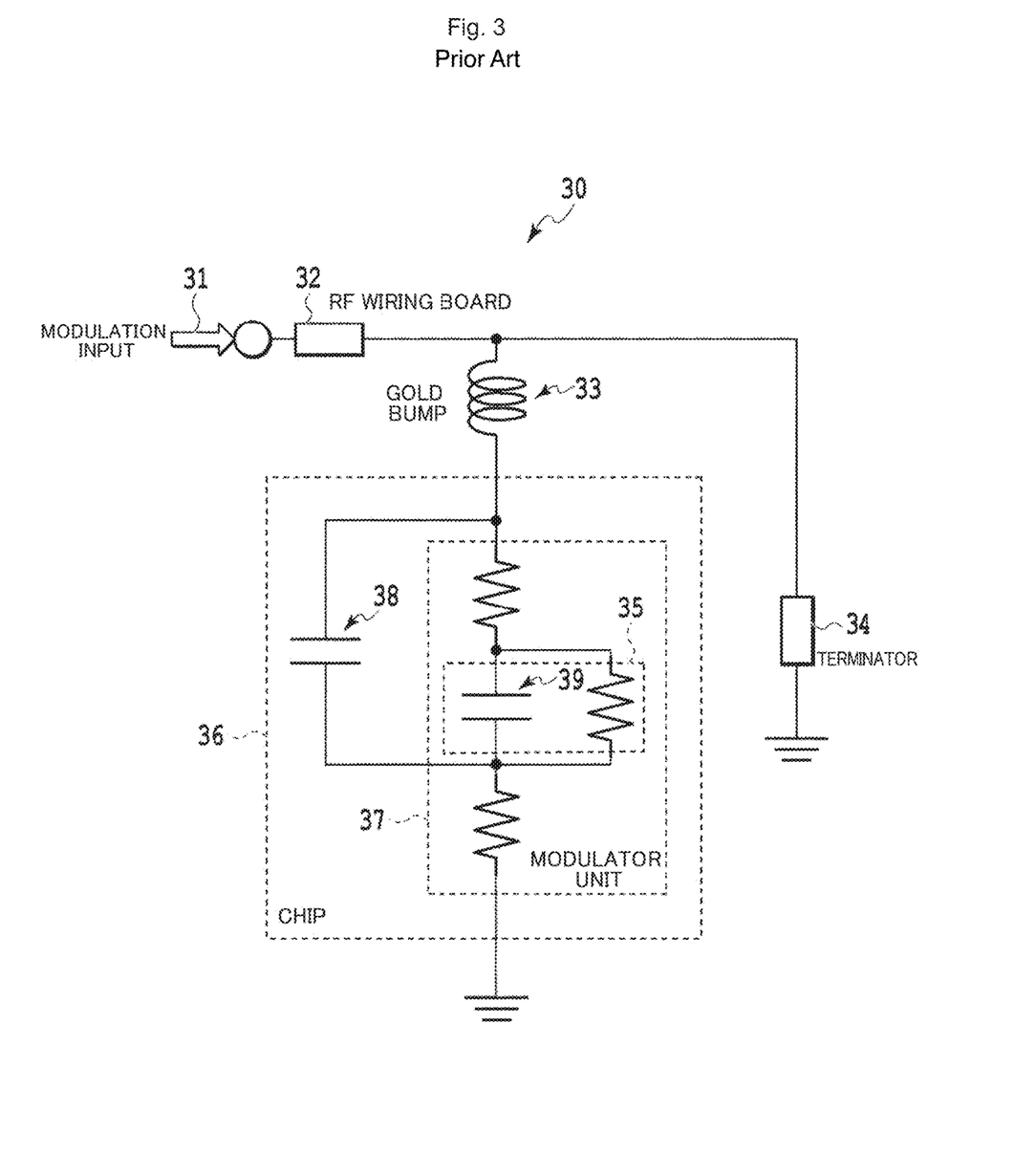
FIG. 3 is a diagram showing an equivalent circuit model of an EA optical modulator subassembly in the conventional art.

FIG. 3 is a diagram showing an equivalent circuit model of an EA optical modulator subassembly in the conventional art. An equivalent circuit model 30 corresponds to the entire EA optical modulator subassembly 20 in FIG. 2, and is divided into a chip part equivalent circuit 36 corresponding to the optical semiconductor chip 10 in FIG. 1 and another equivalent circuit part corresponding to the RF wiring board 22 and the terminator integrated chip 23. The other equivalent circuit is composed of an impedance 32 corresponding to the RF pattern 25, an impedance 34 corresponding to the terminating resistor 26, and an inductor component 33 of a gold bump.

CITATION LIST

Non Patent Literature

[NPL 1] S. Kanazawa et. al., "Equalizer-free transmission of 100-Gbit/s 4-PAM signal generated by flip-chip interconnection EADFB laser module", Feb. 15, 2017, JOURNAL OF LIGHTWAVE TECHNOLOGY, VOL. 35, NO. 4

SUMMARY OF THE INVENTION

Technical Problem

Here, focusing on an equivalent circuit 36 of an optical semiconductor chip 10, a parasitic capacitance 38 corresponding to an electrode pad 11 has already been considerably reduced by the configuration such as embedding a low-dielectric-constant material 17 shown in FIG. 1. For bandwidth characteristics of an optical modulator, a depletion layer capacitance 39 in an equivalent circuit 35 corresponding to a light absorption part 15 has a dominant influence in an equivalent circuit 37 of an optical semiconductor modulator unit in the optical semiconductor chip 10.

When an optical modulator having a higher speed and a wider bandwidth is realized, there is a new problem that frequency response characteristics and reflection characteristics are limited by a depletion layer capacitance of a light absorption part. The present invention has been made in view of such problems, and an object of the present invention is to realize an optical modulator having a higher speed and a wider bandwidth.

Means for Solving the Problem

In order to achieve such an object, one embodiment of the present invention provides an optical semiconductor chip, including: a laser light source; an optical modulator being optically connected to the laser light source and having an optical waveguide structure having a first type semiconductor base layer, a light absorption layer and a second type semiconductor layer arranged in this order; an electrode pad receiving a modulation signal; a modulation electrode being formed on the second type semiconductor layer; and a high frequency line connecting the electrode pad and the modulation electrode and providing inductance in series with respect to a depletion layer capacitance of the optical waveguide. The optical semiconductor chip can operate as an electro absorption optical modulator.

Effects of the Invention

As described above, the present invention realizes an optical modulator having a higher speed and a wider bandwidth.

DESCRIPTION OF EMBODIMENTS

An optical semiconductor chip of the present disclosure includes a high frequency line between an electrode pad receiving a modulation signal and a modulation electrode on an optical waveguide having a light absorption layer. A depletion layer capacitance is canceled by an inductor component of a high frequency line. When a portion directly below the high frequency line is embedded with a low-dielectric-constant material or is made hollow, the parasitic capacitance is further reduced. The high frequency line may have a zigzag (meander) shape as well as a linear shape. The electrode pad on the optical semiconductor chip can be connected to other substrates including RF lines via bumps or wire bonding. In the following description, since the optical semiconductor chip operates as an EA modulator, the two terms "optical semiconductor chip" and "EA optical modulator chip" are used interchangeably.

Figure 4:
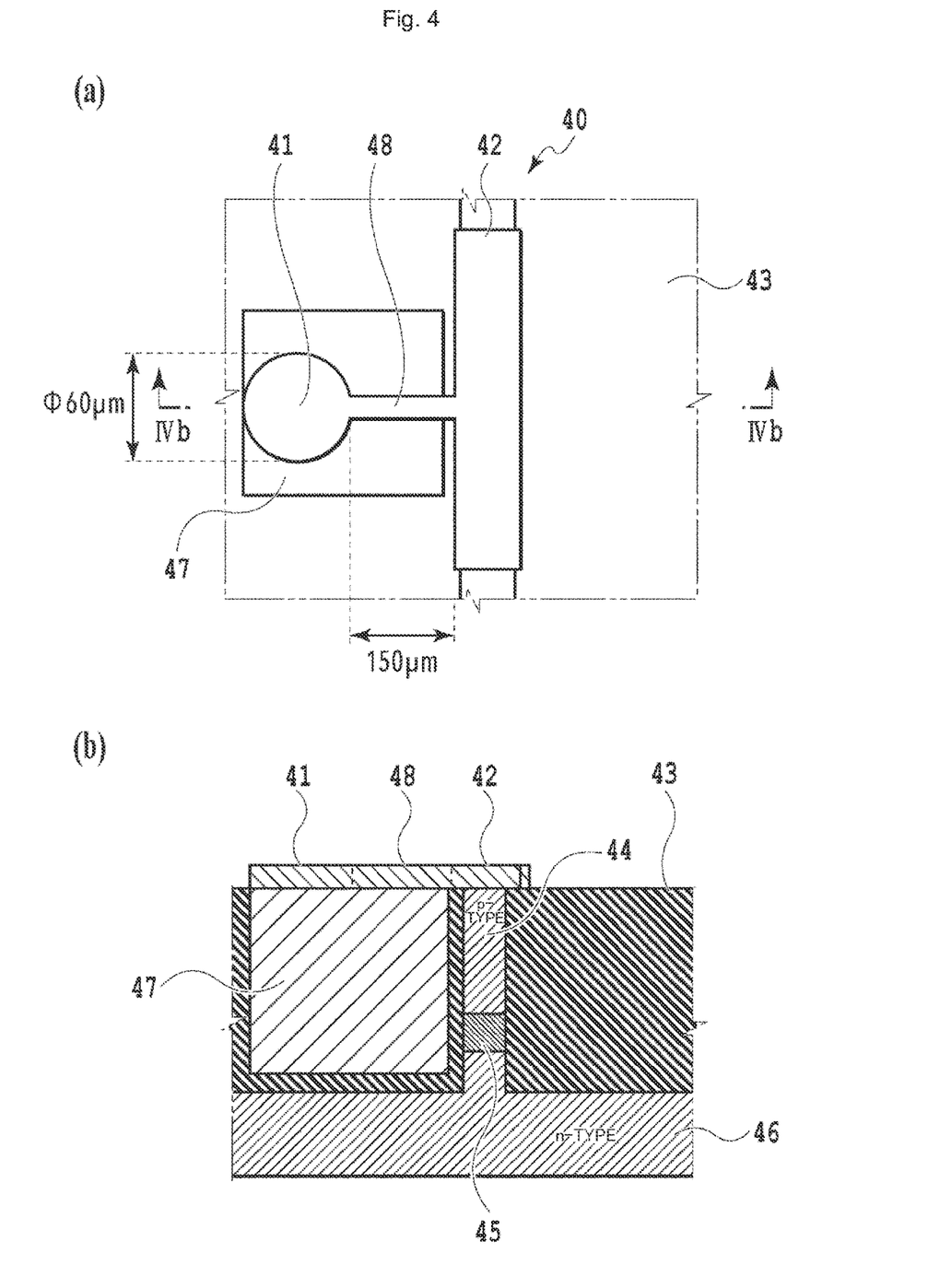
FIG. 4 shows diagrams of a configuration of an optical semiconductor chip of the present disclosure.

FIG. 4 shows diagrams of a configuration of the optical semiconductor chip of the present disclosure, that is, the EA optical modulator chip. Similar to FIG. 1 showing the configuration in the conventional art, FIG. 4(a) shows a top view of a part of an optical semiconductor chip 40 in which an EA optical modulator unit is formed, and FIG. 4(b) shows a cross-sectional view of the substrate taken along the line IVb-IVb. Referring to the cross-sectional view of FIG. 4(b), the EA optical modulator has an optical waveguide structure in which a light absorption layer 45 and a p-type semiconductor layer 44 are formed on an n-type semiconductor substrate 46. Both sides of the optical waveguide are embedded by an insulation layer 43. Light from a laser unit (not shown in FIG. 4) is modulated by applying a modulation signal to a modulation electrode 42 formed on the p-type semiconductor layer 44. The above optical waveguide structure has the same configuration as the EA optical modulator chip in the conventional art in FIG. 1. The difference from the EA optical modulator chip in the conventional art is the configuration between an electrode pad 41 and the modulation electrode 42.

Referring to FIG. 4(a), a high frequency line 48 is provided between the electrode pad 41 receiving a modulation signal via wire bonding, bumps or the like, and the modulation electrode 42. The high frequency line 48 is a high-frequency-transmission line having an inductive impedance up to a predetermined length at a frequency corresponding to a modulation symbol rate. That is, the high frequency line 48 operates as an inductor.

A portion directly below the electrode pad 41 and the high frequency line 48 is embedded with a low-dielectric-constant material 47. Thereby, the capacitive impedance component in the electrode pad 41 and the high frequency line 48 can be made as small as possible. Instead of embedding the entire portion directly below the electrode pad 41 and the high frequency line 48 with the low-dielectric-constant material 47, only a portion directly below the electrode pad 41 may be embedded with the low-dielectric-constant material 47, and a portion directly below the high frequency line 48 can be made hollow. After an electrode is formed on the entire top surface of the chip, by selectively etching and removing only a portion of the low-dielectric-constant material 47 under the high frequency line 48, and leaving the high frequency line 48 in a bridge shape, such a hollow portion can be formed. The low-dielectric-constant material 47 or the hollow portion can further reduce the capacitive impedance component of the electrode pad 41 and the high frequency line 48.

Therefore, the optical semiconductor chip of the present disclosure including a laser light source, an optical modulator being optically connected to the laser light source and having an optical waveguide structure in which the first type semiconductor base layer 46, the light absorption layer 45 and the second type semiconductor layer 44 are arranged in this order, the electrode pad 41 receiving a modulation signal, the modulation electrode 42 formed on the second type semiconductor layer, and the high frequency line 48 which connects the electrode pad and the modulation electrode and provides inductance in series with respect to a depletion layer capacitance of the optical waveguide can be implemented.

Here, the first type and the second type correspond to the type of doping of each part of the above optical waveguide. In the example of FIG. 4, the first type may be an n-type semiconductor, and the second type may be a p-type semiconductor. These types can be reversed. The semiconductor base layer corresponds to a semiconductor substrate on which an optical modulator chip is formed.

Figure 5:
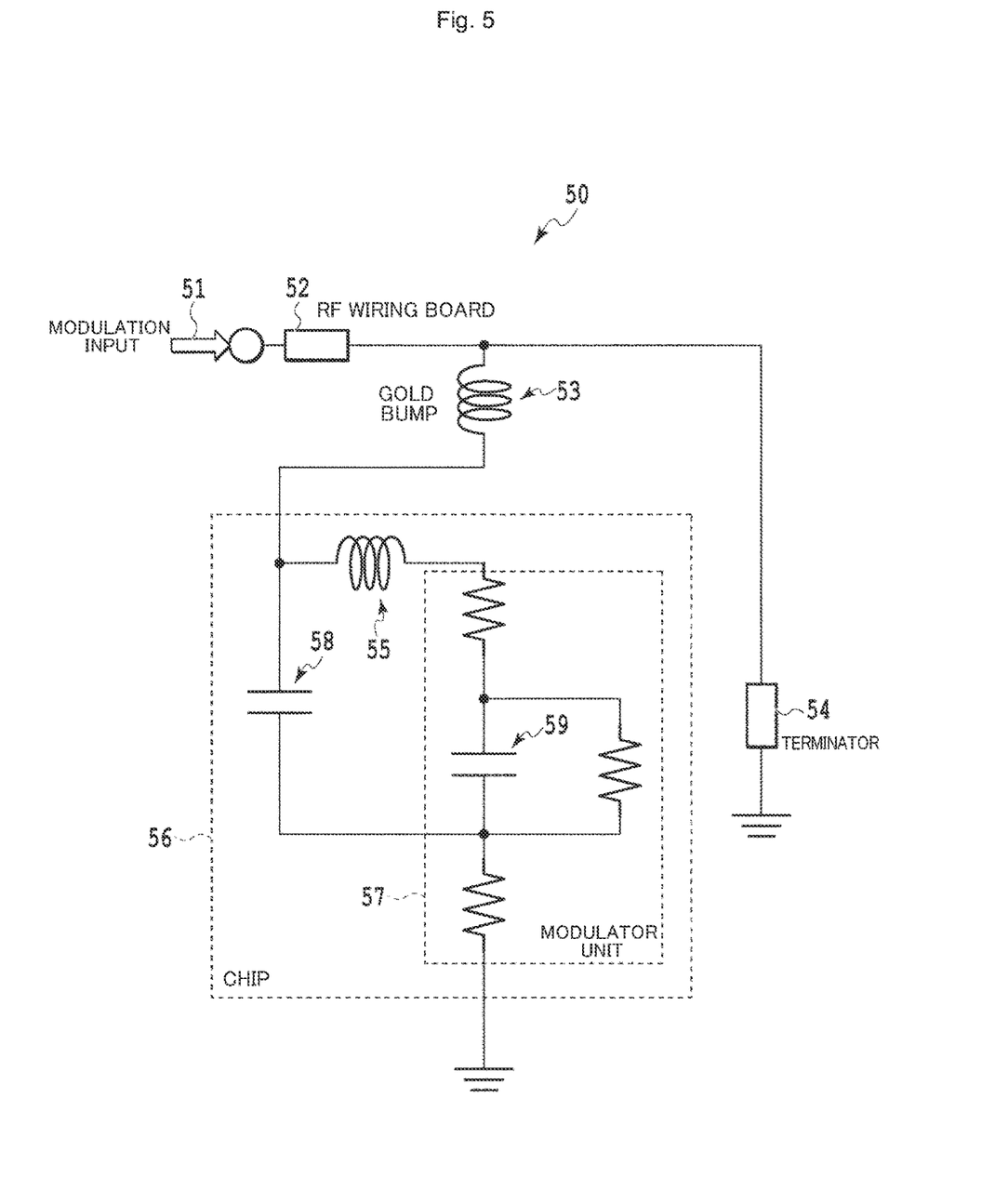
FIG. 5 is a diagram showing an equivalent circuit model of an EA optical modulator subassembly of the present disclosure.

FIG. 5 is a diagram showing an equivalent circuit model of a subassembly including the optical semiconductor chip of the present disclosure. In the optical semiconductor chip 40 of the present disclosure shown in FIG. 4, a configuration between the electrode pad 41 and the modulation electrode 42 is different from that of an optical semiconductor chip 10 in the conventional art. Therefore, the optical semiconductor chip 40 can be mounted in the same configuration as the subassembly shown in FIG. 2. That is, the optical semiconductor chip 10 in the conventional art in FIG. 2 is replaced with the optical semiconductor chip 40 with the configuration in FIG. 4, and can be mounted as a subassembly as shown in FIG. 2 together with an RF wiring board 22 on a subcarrier 21 and a terminator integrated chip 23.

In an equivalent circuit 50 shown in FIG. 5, an impedance 52 corresponding to an RF pattern 25, an impedance 54 corresponding to a terminating resistor 26, and an inductor component 53 of a gold bump are the same as those of the equivalent circuit in FIG. 3. Only an equivalent circuit 56 of the chip part corresponding to the optical semiconductor chip 40 is different from the equivalent circuit of the EA optical modulator subassembly in the conventional art in FIG. 3. That is, in the equivalent circuit 56 of the chip part corresponding to the semiconductor chip 40, an inductance 55 corresponding to the high frequency line 48 is included in series between a parasitic capacitance 58 of the electrode pad 41 and an equivalent circuit 57 of the modulator unit corresponding to the optical waveguide. A depletion layer capacitance 59 in the equivalent circuit 57 of the modulator unit and the inductance 55 are connected in series. Therefore, the decrease in impedance of a capacitive impedance 59 in a high frequency range due to the depletion layer capacitance can be canceled by the increase in impedance of the inductance 55 of the high frequency line 48. Thereby, the reactance component when the chip is viewed from the modulation input side can be made substantially constant, and it is possible to improve frequency response characteristics and reflection characteristics of modulation characteristics. Hereinafter, examples will be described in more detail.

Example 1

Referring to FIG. 4 again, as an example, in the optical semiconductor chip 40 of the present disclosure, InP, GaAs or Si can be used for a substrate. The length of the semiconductor EA optical modulator was 75 μm, the signal line width of the high frequency line 48 was 10 μm, the line length was 150 μm, the thickness of the low-dielectric-constant material 47 was 5 μm, and the specific dielectric constant was 2.3. The electrode pad had a circular shape with a diameter of 60 μm. As the example of the low-dielectric-constant material 47, an organic material such as a polyimide can be used.

In order to compare frequency response characteristics and reflection characteristics of the optical modulator unit of the optical semiconductor chip 40 of the present disclosure shown in FIG. 4 with those in the conventional art, the optical semiconductor chip 40 was mounted in the form of the subassembly shown in FIG. 2, and the performance of the EA optical modulator was checked. For comparison, a subassembly using an EA optical modulator chip 10 shown in FIG. 1 having the same structure as the optical semiconductor chip 40 except that the high frequency line 48 was not provided was formed. In a subassembly 20 shown in FIG. 2, for the RF wiring board 22 and the terminator integrated chip 23, a ceramic material such as aluminum nitride or a quartz plate can be used. For the subcarrier 21, an aluminum nitride substrate or the like can be used.

The optical waveguide of the optical semiconductor chip 40 had a configuration in which the light absorption layer 45 composed of a quantum well structure of InGaAsP and the p-type semiconductor layer 44 composed of p-type InP were sequentially formed on the n-type InP substrate 46. The configuration of each part of these optical waveguides is an example, and in order to produce a laser and an optical waveguide of the EA optical modulator as described above, various configurations can be formed using InP, GaAs, or Si for a substrate. In addition, in the configuration of the optical semiconductor chip 40 in FIG. 4, the substrate side was an n-type semiconductor, but the substrate side can also be a p-type semiconductor. In the electrode pad 41, both a DC bias voltage (−0.5 to −2.5 V) and a modulation signal (0.5 to 2.0 Vpp) were superimposed and applied to the modulation electrode 42 via the RF wiring board 22 from the outside.

The implementation form in which the optical semiconductor chip shown in FIG. 2 was mounted is called a subassembly because the subassembly 20 in FIG. 2 was additionally mounted on a final device such as an optical transmitter and an optical transmission device. The subassembly 20 had an intermediate functional block form for realizing an optical transmitter including an EA optical modulator according to an external modulation method. The subassembly can be simply referred to as an assembly, a module or the like.

Figure 6:
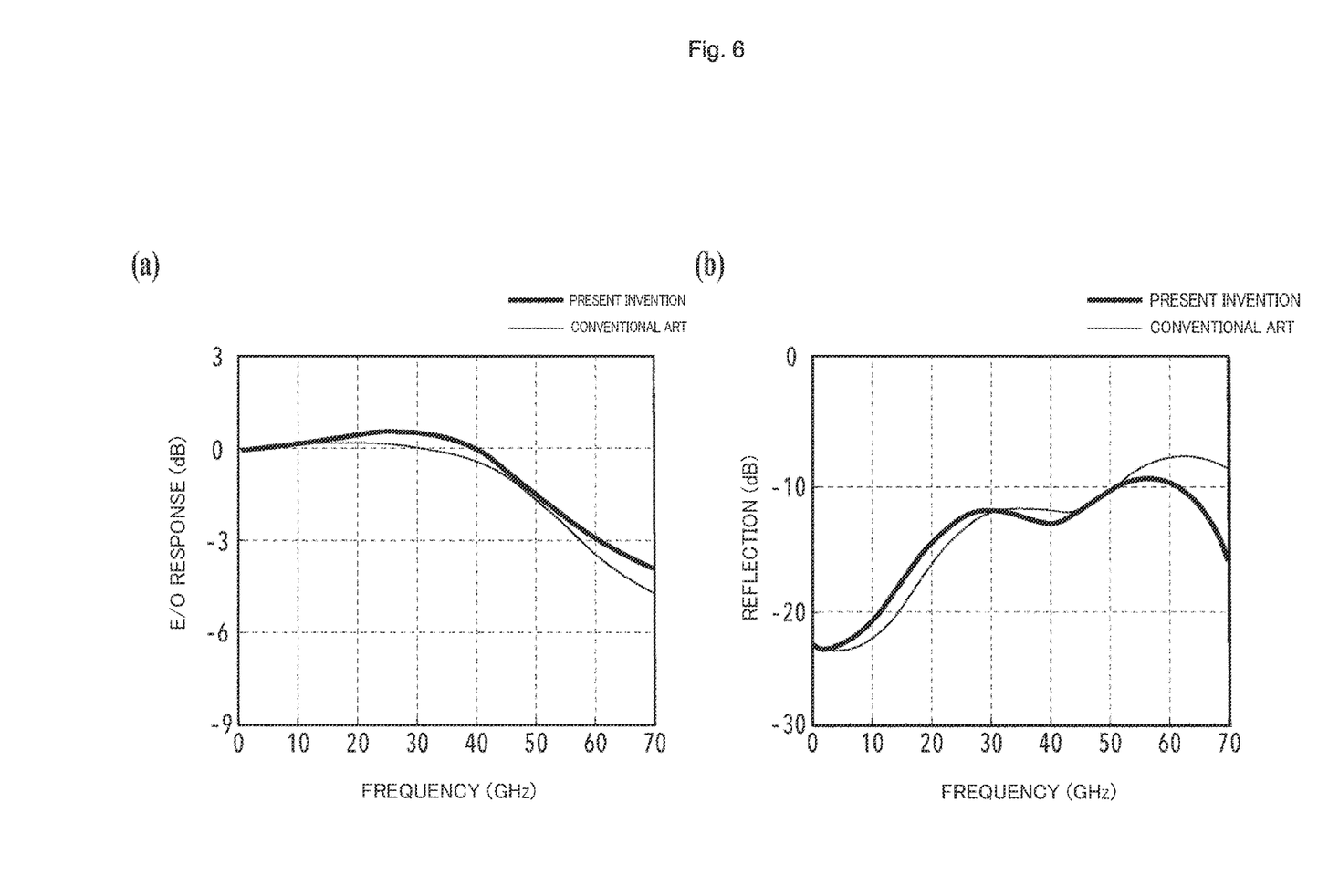
FIG. 6 shows other diagrams of a frequency response of the EA optical modulator subassembly of the present disclosure.

FIG. 6 shows diagrams of frequency response characteristics and reflection characteristics of the subassembly including the optical semiconductor chip of the present disclosure. FIG. 6(a) shows frequency characteristics of electrical/optical response (E/O response), and FIG. 6(b) shows the reflection (return loss) of an input electrical signal in dB. Both can be acquired by an optical component analyzer or the like. In FIG. 6(a), the 3 dB bandwidth of the subassembly using the EA optical modulator chip in the conventional art was 58.3 GHz. On the other hand, when the optical semiconductor chip in FIG. 4 was used, the bandwidth was 61.6 GHz, and the bandwidth was improved by about 3 GHz. In addition, regarding reflection characteristics in FIG. 6(b), in the case of the configuration in the conventional art, the reflection loss (reflection level) increased up to a maximum of about −7 dB in a range up to 70 GHz. On the other hand, in the case of the configuration using the optical semiconductor chip in FIG. 4, the reflection loss was reduced to a maximum of about −9 dB. Based on the drawings in FIG. 6, it was confirmed that, according to the configuration including a high frequency line between the electrode pad receiving a modulation signal and the modulation electrode on the optical waveguide having a light absorption layer, frequency response characteristics and reflection characteristics of the EA optical modulator were improved.

In the next example of the optical semiconductor chip, an example in which a meander structure was used as a high frequency line in place of a linear high-frequency waveguide will be shown.

Example 2

Figure 7:
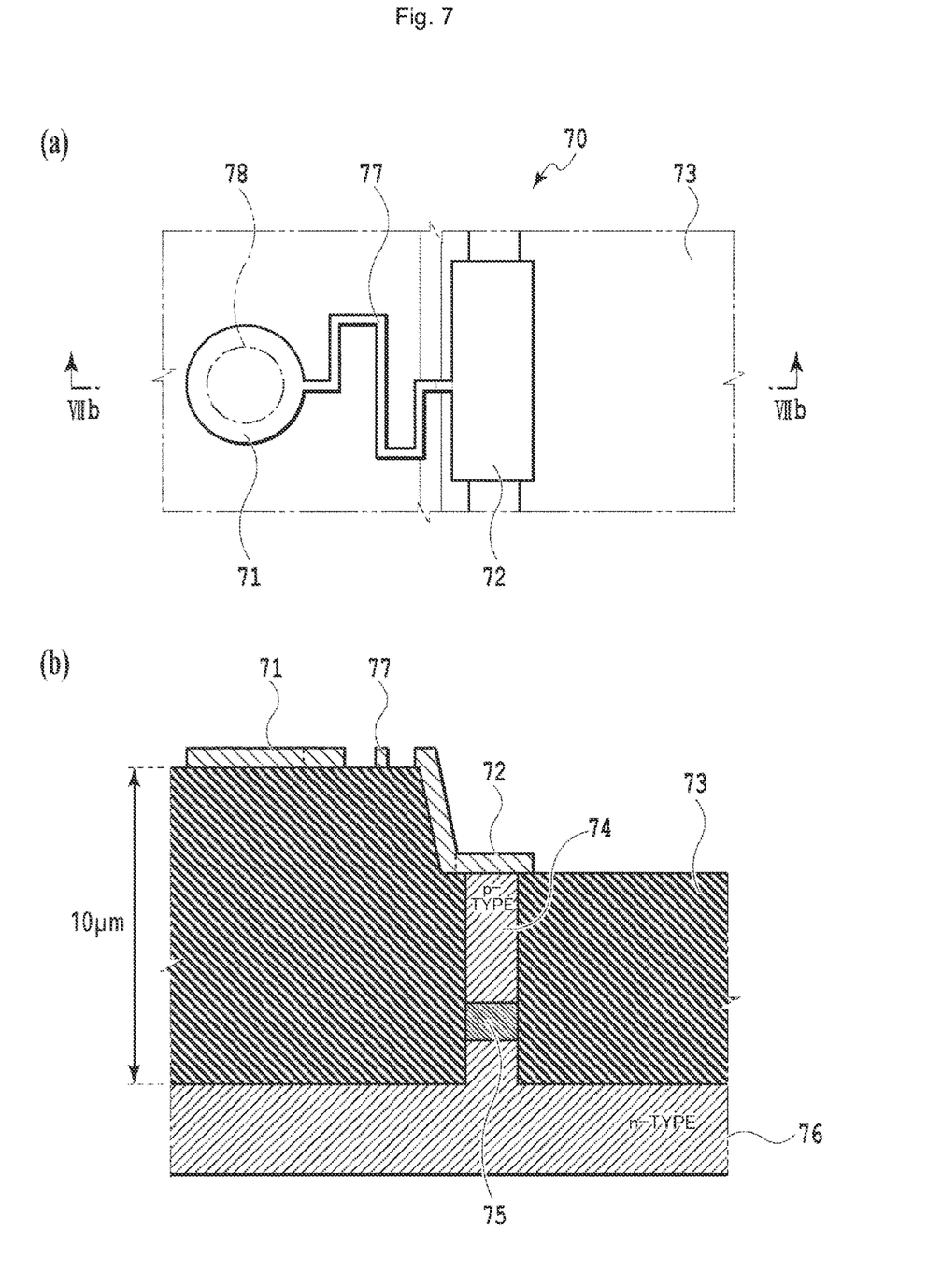
FIG. 7 shows diagrams of a configuration of an optical semiconductor chip of Example 2 according to the present disclosure.

FIG. 7 shows diagrams of a configuration of an optical semiconductor chip of Example 2 according to the present disclosure. FIG. 7(a) is a top view of a part of an optical semiconductor chip 70 in which an EA optical modulator unit was formed, and FIG. 7(b) is a cross-sectional view of the substrate taken along the line VIIb-VIIb. Referring to the cross-sectional view of FIG. 7(b), the optical semiconductor chip 70 had an optical waveguide structure in which a light absorption layer 75 and a p-type semiconductor layer 74 were formed on an n-type semiconductor substrate 76. Both sides of the optical waveguide were embedded by an insulation layer 73. They were embedded by an insulation layer so that an electrode pad 71 was higher than a modulation electrode 72. Light from a laser unit (not shown in FIG. 7) (for example, DFB laser) was modulated with a modulation signal applied to the modulation electrode 72 formed on the p-type semiconductor layer 74. The above optical waveguide structure of the optical semiconductor chip 70 was the same as the structure of the optical semiconductor chip 40 in FIG. 4 except for the configuration of the insulation layer 73 on both sides. The major difference from the semiconductor chip 40 in FIG. 4 was a configuration between the electrode pad 71 and the modulation electrode 72.

In this example, the electrode pad 71 and the modulation electrode 72 were connected by a zigzag-shaped meander wiring 77. In the optical semiconductor chip 70 in FIG. 7, the length of the EA optical modulator, that is, the modulation electrode 72, was 75 μm, and the high frequency line was the meander wiring 77 which is a 0.06 nH inductor. The thickness of the electrode pad 71 and the insulation layer 73 under the meander wiring 77 was set to 10 μm, which was higher than the top surface of the optical waveguide constituting the optical modulator, and the parasitic capacitance generated from the electrode pad 71 or the like was reduced. In Example 1, an example of so-called flip chip mounting using gold bumps is shown, but this example had a configuration in which a wire bonding was connected to a region 78 in the subassembly, and a modulation signal was input to the electrode pad 71.

Figure 8:
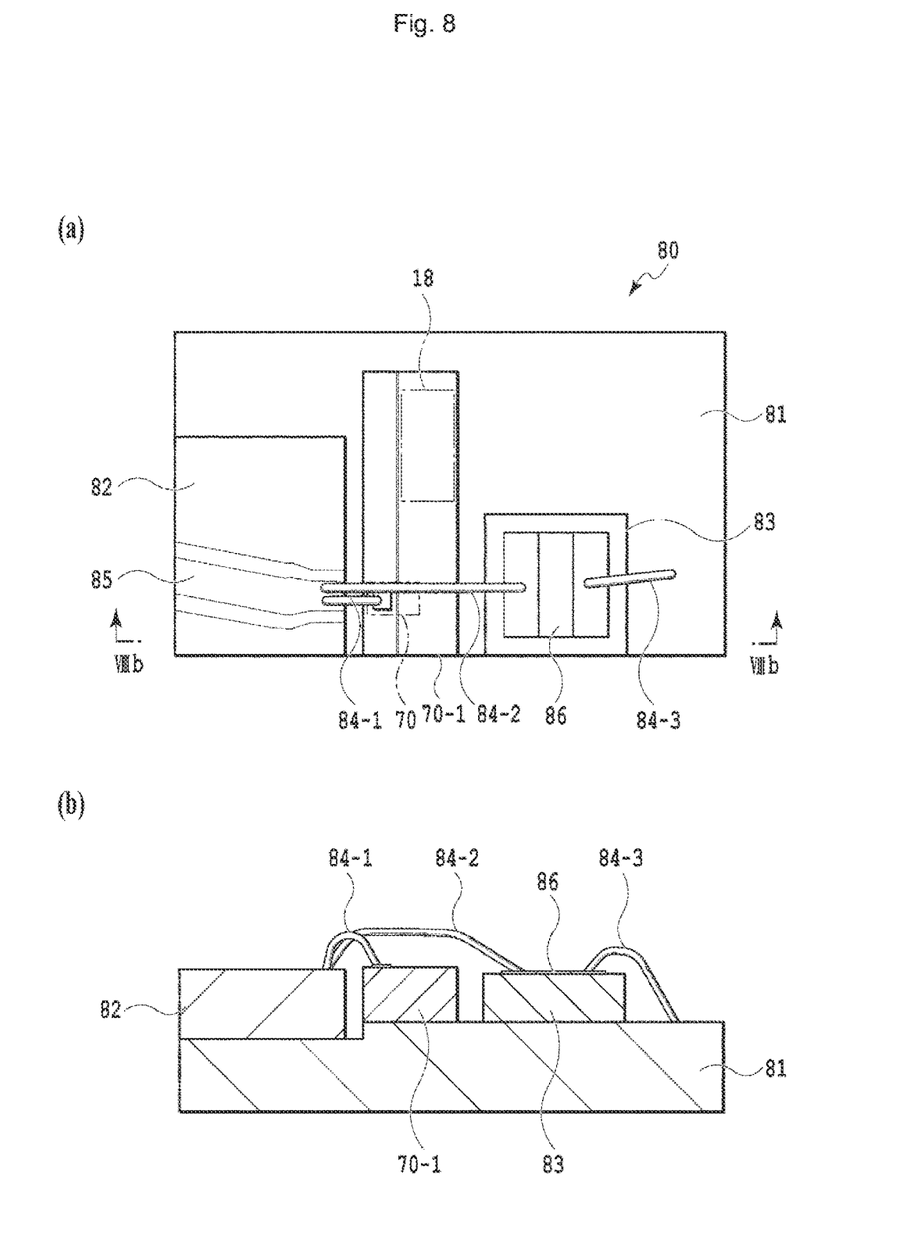
FIG. 8 shows diagrams of a configuration of a subassembly including the optical semiconductor chip of Example 2.

FIG. 8 shows diagrams of a configuration of a subassembly including the EA optical modulator chip of Example 2. FIG. 8(a) shows a top view of a subassembly 80, and FIG. 8(b) shows a cross-sectional view of the subassembly 80 taken along the line VIIIb-VIIIb. Referring to FIG. 2(b), in the subassembly 20, an RF wiring board 82, an optical semiconductor chip 70-1 and a terminator integrated chip 83 were mounted on a subcarrier 81. The RF wiring board 82, the optical semiconductor chip 70-1, and the terminator integrated chip 83 were connected by wires 84-1 to 84-3, respectively. The optical semiconductor chip 70-1 included, for example, a DFB laser 18 and an optical waveguide, and the above EA optical modulator chip 70 shown in FIG. 7 is shown by a dotted rectangular region 70 as a part of the optical semiconductor chip 70-1.

The RF wiring board 82 included an RF pattern 85 receiving a modulation signal, and in the terminator integrated chip 83, a resistor 86 for terminating a modulation signal was formed. The RF pattern 85, and the electrode pad 71 of the optical semiconductor chip 70-1 were connected by the wire 84-1. In addition, the electrode pad 71, and one end of the resistor 86 of the terminator integrated chip 23 were connected by the wire 84-2, and the other end of the resistor 86 was grounded by the wire 84-3.

Figure 9:
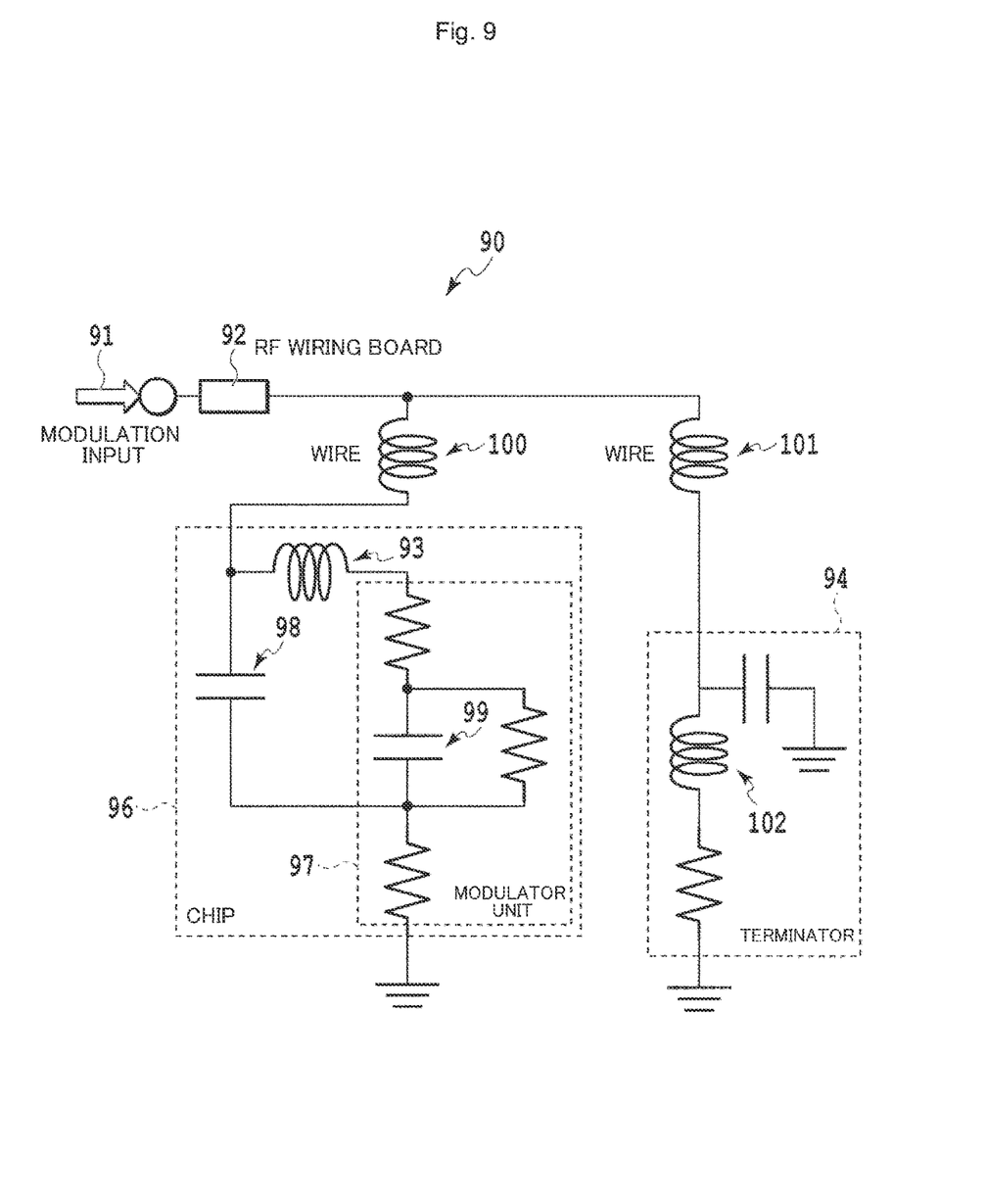
FIG. 9 is a diagram showing an equivalent circuit model of an EA optical modulator subassembly of Example 2.

FIG. 9 is a diagram showing an equivalent circuit model of the subassembly in FIG. 8 including the EA optical modulator chip of Example 2. An equivalent circuit 90 was different from the equivalent circuit 50 of the subassembly of Example 1 shown in FIG. 5 in that the high frequency line 77 become a meander, and was connected by the wires 84-1 to 84-3 in place of gold bumps. A part except for an equivalent circuit 96 of the chip part corresponding to the optical semiconductor chip 70-1 included an equivalent circuit 92 corresponding to the RF wiring board 82, an equivalent circuit 94 corresponding to the terminator integrated chip 83, and inductors 100, 101, and 102 corresponding to the three wires 84-1 to 84-3. The equivalent circuit 96 of the chip part included a parasitic capacitance 98, an inductor 93 corresponding to a meander, and an equivalent circuit 97 corresponding to the optical waveguide of the optical modulator unit. The equivalent circuit 97 included a depletion layer capacitance 99, and limited frequency response characteristics and reflection characteristics.

Figure 10:
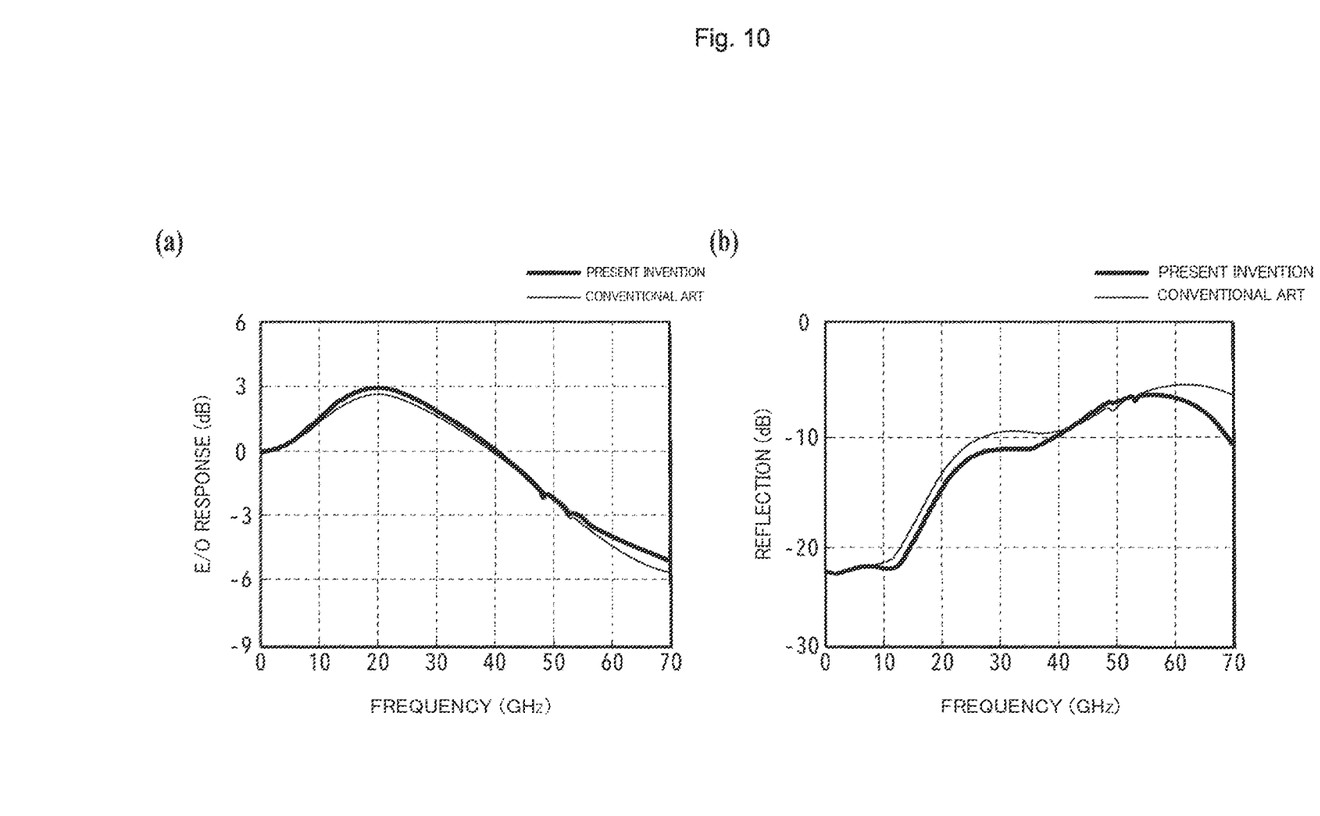
FIG. 10 shows other diagrams of frequency response characteristics of the EA optical modulator subassembly of Example 2.

FIG. 10 shows diagrams of frequency response characteristics and reflection characteristics of the subassembly including the EA optical modulator chip of Example 2. FIG. 10(a) shows frequency characteristics of E/O response, and FIG. 10(b) shows the reflection of an input electrical signal in dB. Frequency characteristics of the subassembly when the EA optical modulator chip 10 in the conventional art in FIG. 1 was mounted using wire bonding as in FIG. 8 are also shown. In FIG. 10(a), the 3 dB bandwidth of the subassembly using the EA optical modulator chip in the conventional art was 53.2 GHz. On the other hand, when the optical semiconductor chip of Example 2 in FIG. 7 was used, the bandwidth was 55 GHz, and the bandwidth was improved by about 1.8 GHz. In addition, for reflection characteristics in FIG. 10(b), in the case of the configuration in the conventional art, the reflection loss (reflection level) increased up to a maximum of about −5 dB in a range up to 70 GHz. On the other hand, in the case of the configuration using the optical semiconductor chip in FIG. 7, the reflection loss was reduced to a maximum of about −6 dB. Based on the drawings in FIG. 10, it was confirmed that, according to the configuration including a high frequency line by a meander between the electrode pad receiving a modulation signal and the modulation electrode on the optical waveguide having a light absorption layer, frequency response characteristics and reflection characteristics of the EA optical modulator were improved. In addition, it was effective in reducing the parasitic capacitance by forming the insulation layer so that the insulation layer directly below the electrode pad and the high frequency line was made thick.

Figure 11:
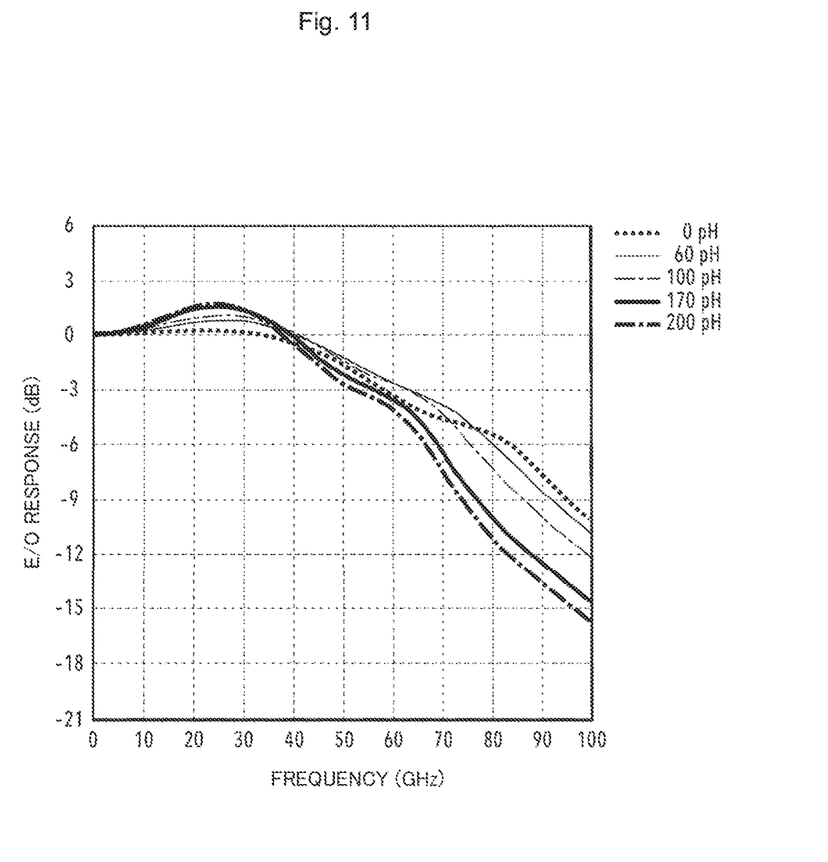
FIG. 11 is a diagram illustrating the effect of widening a bandwidth of an optical modulator by a serial inductor.

Here, it has been confirmed that the amount of improvement in the 3 dB bandwidth when an inductance component is added in series depends on the length of the laser unit (modulation electrode). The results of E/O response shown in FIG. 11 show an example when the EA length (the length of the modulation electrode) was 75 μm. For example, when the EA length was shorter, the optimal inductance value changed to a smaller value. The configuration from the electrode pad to the modulation electrode in the EA modulator chip in the conventional art was for reducing unnecessary inductance and the capacitance as much as possible and securing an electrode structure sufficient for wire bonding. Therefore, the distance between the electrode pad and the modulation electrode was short as possible and reduced to a maximum of 30 μm or less. It should be noted that the EA modulator chip of the present disclosure differed from that in the conventional art in that the high frequency line operated as an inductor (inductive reactance) added in series to the modulator unit when viewed from the modulation input side.

As described above, when the inductor component of the high frequency line was provided in series between the electrode pad in the EA optical modulator chip and the modulation electrode on the optical waveguide functioning as the optical modulator, the depletion layer capacitance of the optical waveguide was canceled. The line width of the inductor component is not limited as long as it has a line width that provides a predetermined characteristic impedance at, for example, a frequency of the modulation signal (for example, the symbol frequency). In addition, the line length may be in a range in which the impedance of the high frequency line becomes an inductive reactance. In order to reduce the parasitic capacitance in the optical waveguide and in order to add inductance in series, the width of the high frequency lines 48 and 77 is preferably narrow, but there is a problem of the physical strength of the electrode in a width of microns or less. Therefore, a range of the diameter of the electrode pad 71 or less and 1 μm or more is preferable.

In the EA optical modulator chip of the present disclosure, in the equivalent circuits 56 and 96 corresponding to the optical semiconductor chip, the inductances 55 and 93 were included in series between the parasitic capacitances 58 and 98 of the electrode pads 41 and 71 and the equivalent circuits 57 and 97 of the modulator unit corresponding to the optical waveguide. The depletion layer capacitances 59 and 99 and the inductances 55 and 93 in the equivalent circuits 57 and 97 of the modulator unit were connected in series. Therefore, the reactance component was canceled, and deterioration of high frequency characteristics due to the capacitive impedances 59 and 99 of the depletion layer capacitance can be reduced. The effect of serial inductance can be confirmed from the following simulation.

FIG. 11 is a diagram illustrating the effect of widening a bandwidth of a modulator by a serial inductor. In FIG. 11, when the EA optical modulator chip having a high frequency line by a meander shown in the drawing was used to constitute a subassembly by a flip chip as shown in FIG. 2, the effect of the inductor on the frequency characteristics of E/O response was simulated. The dotted line 0 pH corresponded to the structure in the conventional art not including the high frequency line. It can be understood that, when the inductance was around 60 to 100 pH, the 3 dB bandwidth was the maximum, and when the inductance was around 170 pH, bandwidth characteristics were the same as those in the structure in the conventional art. In addition, it can be understood that, when the inductance increased to 200 pH, adversely, the bandwidth deteriorated as compared with when no high frequency line was applied. Therefore, in an optical modulator composed of an InP substrate, the inductance added by the high frequency line was preferably about 170 pH (0.17 nH) or less. It was confirmed from the simulation that the inductance component added by the high frequency line was selected according to the depletion layer capacitance of the optical waveguide corresponding to the configuration of the optical modulator, and the modulation bandwidth of the EA optical modulator can be maximized.

As described above in detail, according to the configuration of the optical semiconductor chip of the present disclosure, it is possible to realize an optical modulator having a higher speed and a wider bandwidth.

INDUSTRIAL APPLICABILITY

The present invention can be generally used in an optical communication system.

REFERENCE SIGNS LIST 10, 40, 70 Optical semiconductor chip
11, 41, 71 Electrode pad
12, 42, 72 Modulation electrode
13, 43, 73 Insulation layer
14, 44, 74 p-type semiconductor layer
15, 45, 75 Light absorption layer (active layer)
16, 46, 76 n-type semiconductor substrate
17, 47 low-dielectric-constant material
20, 80 Subassembly
21, 81 Subcarrier
22, 82 RF wiring board
23, 83 Terminator integrated chip
38, 58, 98 Parasitic capacitance
39, 59, 99 Depletion layer capacitance
48, 77 High frequency line
49 Hollow portion

The invention claimed is:

1. An optical semiconductor chip, comprising:
a laser light source;
an optical modulator optically connected to the laser light source and having an optical waveguide structure, the optical waveguide structure having a first type semiconductor base layer, a light absorption layer and a second type semiconductor layer arranged in this order;
an electrode pad receiving a modulation signal;
a modulation electrode formed on the second type semiconductor layer; and
a high frequency line connecting the electrode pad and the modulation electrode and providing inductance in series with respect to a depletion layer capacitance of the optical waveguide structure;
wherein a portion under the high frequency line and the electrode pad is composed of a material having a dielectric constant lower than a dielectric constant of the semiconductor base layer,
the material is configured such that the electrode pad is higher than the modulation electrode, and
the high frequency line is a meander wiring.

2. The optical semiconductor chip according to claim 1, wherein a line width of the high frequency line is narrower than a width of the electrode pad.

3. The optical semiconductor chip according to claim 1, wherein the amount of inductance of the high frequency line is 0.17 nH or less.

4. The optical semiconductor chip according to claim 1, wherein the laser light source is a distributed feedback (DFB) laser.

5. An optical modulator assembly, comprising:
an optical semiconductor chip, comprising:
    a laser light source;
    an optical modulator optically connected to the laser light source and having an optical waveguide structure, the optical waveguide structure having a first type semiconductor base layer, a light absorption layer and a second type semiconductor layer arranged in this order;
    an electrode pad receiving a modulation signal;
    a modulation electrode formed on the second type semiconductor layer; and
    a high frequency line connecting the electrode pad and the modulation electrode and providing inductance in series with respect to a depletion layer capacitance of the optical waveguide structure;
a chip in which terminators are integrated; and
a wiring board for leading the modulation signal.

* * * * *